(12) United States Patent
Thomas

(10) Patent No.: US 6,664,188 B2
(45) Date of Patent: Dec. 16, 2003

(54) SEMICONDUCTOR WAFER WITH A RESISTANT FILM

(76) Inventor: Terence M. Thomas, 209 Cullen Way, Newark, DE (US) 19711

( * ) Notice: Subject to any disclaimer, the term of this patent is extended or adjusted under 35 U.S.C. 154(b) by 28 days.

(21) Appl. No.: 09/916,130

(22) Filed: Jul. 26, 2001

(65) Prior Publication Data

US 2003/0020141 A1 Jan. 30, 2003

(51) Int. Cl.⁷ .............................. H01L 21/302
(52) U.S. Cl. ....................... 438/692; 438/693
(58) Field of Search ................. 438/690, 691, 438/692, 693; 156/345

(56) References Cited

U.S. PATENT DOCUMENTS

| | | | | |
|---|---|---|---|---|
| 4,885,262 A | * | 12/1989 | Ting et al. | 438/669 |
| 5,395,801 A | * | 3/1995 | Doan et al. | 438/633 |
| 5,618,381 A | * | 4/1997 | Doan et al. | 438/633 |
| 5,637,185 A | * | 6/1997 | Murarka et al. | 156/345.13 |
| 5,688,720 A | * | 11/1997 | Hayashi | 438/633 |
| 5,916,453 A | | 6/1999 | Beilin et al. | |
| 6,051,496 A | | 4/2000 | Jang | |
| 6,069,082 A | | 5/2000 | Wong et al. | |
| 6,103,625 A | | 8/2000 | Marcyk et al. | |
| 6,153,523 A | | 11/2000 | Van Ngo et al. | |

FOREIGN PATENT DOCUMENTS

EP          0 590 871 A        4/1994

* cited by examiner

Primary Examiner—Kin-Chan Chen
(74) Attorney, Agent, or Firm—Gerald K. Kita; Blake T. Biederman

(57) ABSTRACT

A semiconductor wafer adapted for planarization by polishing the wafer with a polishing pad and a polishing fluid, the wafer having a metal layer, and a resistant film formed selectively on low topography features of the metal layer to resist the polishing fluid while high topography features of the metal layer are removed by said polishing, which minimizes a time duration for attaining planarization of the wafer by said polishing.

10 Claims, 2 Drawing Sheets

SEMICONDUCTOR WAFER WITH A RESISTANT FILM

FIELD OF THE INVENTION

The invention relates to planarization of a semiconductor wafer by polishing the wafer with a polishing pad and a polishing fluid.

BACKGROUND OF THE INVENTION

An integrated circuit comprises many semiconductor transistors that are electrically connected to one another by circuit interconnects constructed as tiny metal lines. The metal lines transmit electrical signals that operate the transistors. The transistors and circuit interconnects are of miniature size, and are constructed according to semiconductor manufacturing processes that involve formation of the transistors and circuit interconnects by depositing or growing different semiconductor materials on a wafer of silicon, i.e., a semiconductor wafer.

A semiconductor wafer is adapted for manufacture thereon of many circuit interconnects arranged according to a pattern. Circuit interconnects are constructed on a semiconductor wafer, by depositing a dielectric layer on an underlying silicon wafer, followed by recessing tiny trenches in the surface of the dielectric layer, the trenches being arranged in a pattern, followed by applying a known barrier film on the dielectric layer, followed by depositing a layer of metal onto the underlying barrier film and dielectric layer to assure that the trenches are filled with metal. A process known as chemical mechanical planarization, CMP, is performed with a polishing pad and a polishing fluid to remove the layer of metal and the barrier film from the underlying dielectric layer, and to provide a polished surface that is smooth and planar. Thus, the process of CMP is often described as a method of polishing a semiconductor substrate, or as a method of planarizing a semiconductor substrate.

An aim of the process of CMP is to polish the metal in the trenches to a height that is substantially the same height as that of the smooth, planar polished surface. The polished metal in the trenches provides the circuit interconnects. The dielectric layer with the circuit interconnects provides a substrate on which successive dielectric layers are constructed. The successive dielectric layers have additional circuit interconnects to provide successive layers of circuit interconnects for integrated circuits that are constructed in large numbers on the patterned wafer.

Planarizing a semiconductor substrate by CMP is performed with a polishing pad and a polishing fluid, which together remove material from the surface of the substrate. The polishing pad rubs against the surface to remove material by abrasion. Simultaneously, the polishing fluid is dispensed at an interface of the polishing pad and the substrate. The polishing fluid chemically reacts with the surface, and dissolves material that results from chemical reaction of the surface with the polishing fluid. Thus, material is removed from the surface by both mechanical abrasion and chemical reaction.

The surface has a surface topography with high topography features, i.e., high spots, and low topography features, i.e., low spots. The wafer is planarized, by CMP polishing of the surface with a polishing pad and a polishing fluid, which removes material from the topography features, until the topography features become substantially the same height. However, the polishing fluid reacts chemically with both the high spots and the low spots, and removes material from both of them. Thus, polishing the high spots and the low spots to the same height is counteracted by having the polishing fluid react chemically with the low spots.

The metal circuit interconnects in the trenches have corresponding low spots in the metal layer prior to a polishing operation. When such low spots on the circuit interconnects are polished by CMP, too much of the metal can be removed, as indicated by the presence of excessive concavity in the polished surfaces of the circuit interconnects. Dishing is a term that refers to the concavity in the circuit interconnects, as caused by CMP. Dishing is a structural defect of the circuit interconnects that contributes to unwanted attenuation of the signals transmitted by the circuit interconnects. Accordingly, a CMP process must be performed with care to minimize dishing.

Attempts have been undertaken to hasten the process of planarization by CMP, which would lower manufacturing costs. However, increasing the speed of a CMP process to rapidly remove material from the surface of a semiconductor wafer, causes rapid dishing, and causes an uneven polished surface, which is indicative of deficient planarization. Thus, a need exists for an invention that minimizes dishing, while minimizing the time duration for planarizing a surface by polishing with a polishing pad and a polishing fluid.

SUMMARY OF THE INVENTION

The invention minimizes the time duration for planarizing a surface on a semiconductor wafer by polishing the surface with a polishing pad and a polishing fluid.

The invention adapts a semiconductor wafer for removal of high topography features at a faster removal rate than for low topography features. The invention further adapts a semiconductor wafer to minimize dishing of circuit interconnects, while the high topography features are removed by polishing with a polishing pad and a polishing fluid.

The invention adapts a semiconductor wafer for minimized removal rate of the low topography features, while the high topography features are removed by polishing with a polishing pad and a polishing fluid.

Further, the invention adapts a semiconductor wafer to minimize dishing, while the high topography features are removed by polishing with a polishing pad and a polishing fluid.

The invention pertains to a process according to which, a resistant film is selectively formed on low topography features on a semiconductor wafer. Further, the invention pertains to a semiconductor wafer adapted for polishing with a polishing pad and a polishing fluid with which high topography features on the wafer chemically react and dissolve, and low topography features on the wafer have a resistant film that resists the polishing fluid. Further, the invention pertains to apparatus for forming a resistant film selectively on low topography features on a semiconductor wafer.

DESCRIPTION OF THE DRAWINGS

Embodiments of the invention will now be described, by way of example, with reference to the accompanying drawings.

DETAILED DESCRIPTION

Figure 1:
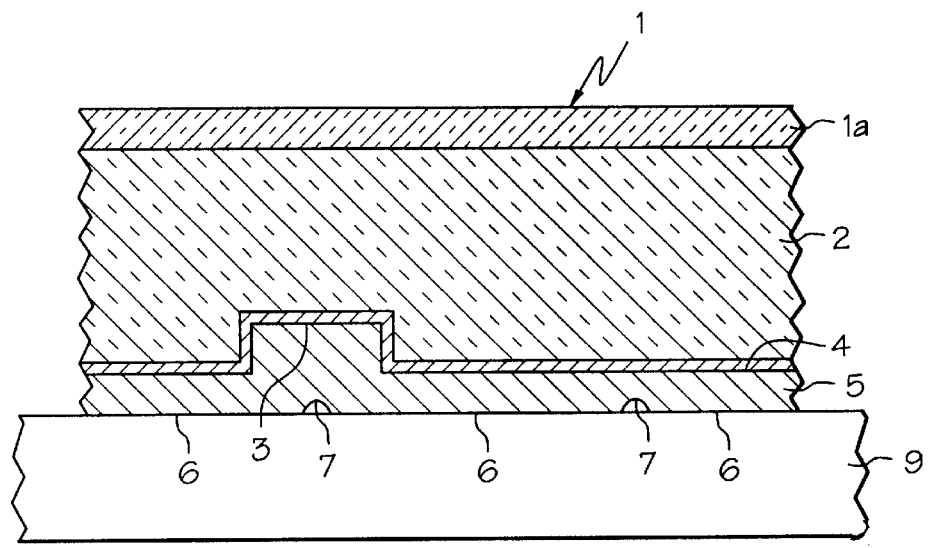
FIG. 1 is a fragmentary, enlarged, edgewise view of a semiconductor wafer that is inverted and impinging a shield, the wafer having high topography features and low topography features.

FIG. 1 discloses a semiconductor wafer 1, shown inverted. The semiconductor wafer 1 includes, a thin silicon wafer 1a on which is deposited a dielectric layer 2. FIG. 1 discloses one of a number of trenches 3 that are constructed in the dielectric layer 2, according to known photoetching, manufacturing operations. A barrier film 4 is deposited on the dielectric layer 2 that underlies the barrier film 4. A metal layer 5 is deposited on the barrier film 4 to overlie the underlying dielectric layer 2, and to assure that portions of the metal of the metal layer 5 fills the trenches 3 in the dielectric layer 2. The metal layer 5 has a surface topography, shown inverted in FIG. 1, with high topography features 6 and low topography features 7. The metal in the trenches 3 have low topography features 7, as the expected result of deposition of the metal layer 5. Low topography features 7 that occur elsewhere are due to recessed imperfections in the metal layer 5.

According to known manufacturing operations, the semiconductor wafer 1, disclosed by FIG. 1, is polished with a polishing pad and a polishing fluid, according to a known CMP operation. A first phase of CMP is performed to planarize the semiconductor wafer 1. Planarization of the semiconductor wafer 1 is attained, when the high topography features 6 and the low topography features 7 are polished to substantially the same height, with minimized dishing. After planarization is attained, a second phase of CMP is performed until a remainder of the metal layer 5 is removed from the underlying dielectric layer 2, and the dielectric layer 2 is polished to a smooth, planar polished surface. Further, the metal in the trenches 3 are polished to a height that is substantially the same height as a planar polished surface on the semiconductor wafer 1, with minimized dishing.

The invention adapts the semiconductor wafer 1 for planarization by the first phase of polishing. Further, the invention minimizes the time duration for the polishing operation to attain planarization. Further the invention minimizes dishing by the polishing operation.

Figure 2:
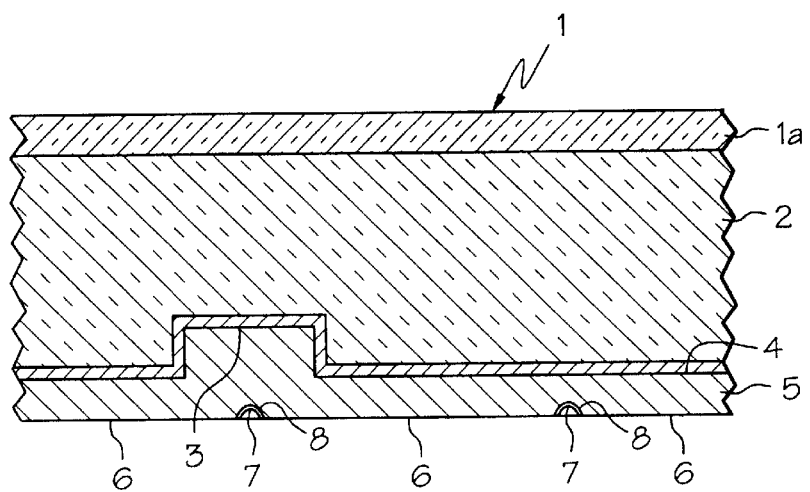
FIG. 2 is a view similar to FIG. 1, and discloses the wafer as having a resistant film formed selectively on low topography features.

FIG. 2 discloses a resistant film 8 selectively formed on the low topography features 7. According to an embodiment of the invention, FIG. 1 further discloses the semiconductor wafer 1 inverted, with the high topography features 6 impinging a shield 9. For example, according to an embodiment of the invention, the semiconductor wafer 1 is held in impingement with the shield 9 by the mechanism of acceleration of gravity. The resistant film 8 forms on the low topography features 7 that are spaced from the shield 9. According to an embodiment of the invention, a film forming gaseous atmosphere, that has film forming, gaseous constituents, is introduced in spaces between the shield 9 and the low topography features 7. A resistant film 8 is formed by contact of the gaseous atmosphere with the low topography features 7. Thus, the semiconductor wafer 1 is adapted for planarization by the first phase of polishing.

The formation of a resistant film 8 on the high topography features 6 is minimized, such that the high topography features 6 are without substantial amounts of the resistant film 8, which enables the high topography features 6 to react chemically with the polishing fluid and dissolve, while polishing the metal layer 5 with a polishing pad and a polishing fluid.

Upon polishing the metal layer 5 with a polishing pad and with a polishing fluid, the resistant film 8 resists the polishing fluid, while the high topography features 6 chemically react with the polishing fluid and dissolve, according to known CMP operations. The high topography features 6 are removed by abrasion applied by the polishing pad, and by chemical reaction and dissolution. The low topography features 7 having the resistant film 8 are farther from the polishing pad than the high topography features 6, and are subject to little or no abrasion, as compared with the abrasion applied by the polishing pad on the high topography features 6. Further, the resistant film 8 resists chemical reaction and dissolution of the low topography features 7, while the high topography features 6 are removed by chemical reaction with the polishing fluid, and then dissolution. Thus, said polishing removes the high topography features 6 at a faster removal rate than the low topography features 7, which minimizes the time duration for attaining planarization by polishing. Further, because, the resistant film 8 resists the polishing fluid, the low topography features 7, including those corresponding to metal in the trenches 3, resist chemical reaction and dissolution, while polishing the semiconductor wafer 1 by CMP. Thus, dishing of the metal in the trenches 3 is minimized.

Figure 3:
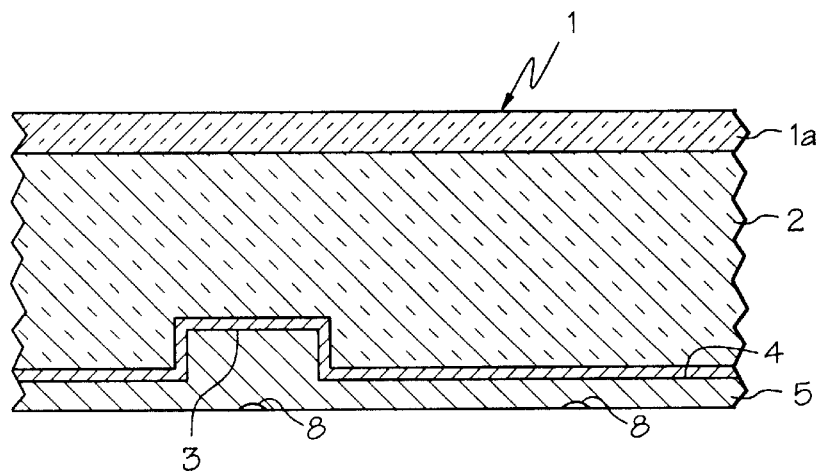
FIG. 3 is a view similar to FIG. 2, and discloses the wafer after polishing to remove high topography features from the wafer.

FIG. 3 discloses the semiconductor wafer 1 with the high topography features 6 having been polished, to become substantially the same height as the low topography features 7. The low topography features 7 continue to have some of the resistant film 8 thereon. Polishing with a polishing pad and a polishing fluid continues, such that the high topography features 6 and the low topography features 7 with the resistant film 8 thereon, while at the same height, are subjected to the same abrasion, as applied by the polishing pad.

According to an embodiment of the resistant film 8, comprising a metallic compound of the metal in the metal layer 5, rubbing thereof by the pad breaks the surface tension of the polishing fluid in contact with the resistant film 8, enabling the resistant film 8 to react chemically with the polishing fluid and dissolve, which removes the resistant film 8 by chemical reaction with the polishing fluid, as well as, by abrasion applied by the polishing pad.

According to an embodiment of the resistant film 8, comprising a substance that is not a metallic compound of the metal layer 5, continued polishing will remove the resistant film 8 primarily by abrasion. The high topography features 6 and the low topography features 7 having the resistant film 8, now at the same height, are removed substantially evenly by both abrasion, and chemical reaction. They are removed substantially evenly from the underlying dielectric layer 2 by continued polishing, which further provides a smooth, planar polished surface with minimized dishing.

Figure 4:
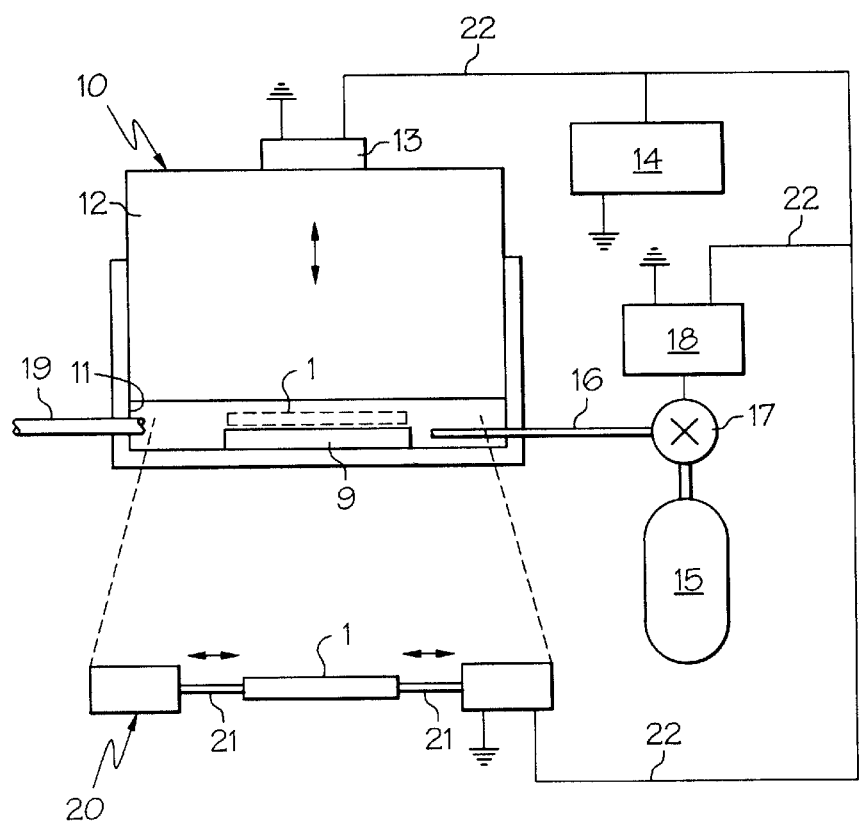
FIG. 4 is a schematic view of apparatus for adapting a semiconductor wafer with a resistant film formed selectively on low topography features on the wafer.

FIG. 4 discloses apparatus 10 for adapting the wafer 1 with a resistant film 11. The apparatus 10 includes, a chamber 11 containing the shield 9 for impingement against a corresponding wafer 1. A door 12 on the chamber 11 opens an amount sufficient for receiving the semiconductor wafer 1 edgewise as the wafer 1 is inserted into the chamber 11. The wafer 1 is positioned adjacent to the shield 9, while a film forming, gaseous atmosphere is introduced into the chamber 11. Further, the gaseous atmosphere is introduced between the wafer 1 and the shield 9. The wafer 1 is shown in broken outline, in FIG. 4. Further, the wafer 1 is inverted and impinges the shield 9, similarly as disclosed by FIG. 1. Relative movement of the wafer 1 and the shield 9 causes the wafer 1 to impinge the shield 9. The gaseous atmosphere between the wafer 1 and the shield 9 becomes trapped in the spaces between the shield 9 and the low topography features 7 on the wafer 1. The door 12 is closed, while the gaseous atmosphere is in contact with the low topography features 7. A resistant film 8 forms on the low topography features 7 by contact of the gaseous atmosphere with the low topography features 7. Subsequently, the door 12 is opened, and the semiconductor wafer 1 is removed from the chamber 11.

According to an embodiment disclosed by FIG. 4, the door 12 is opened and closed by a motor driven, door operating mechanism 13 that is operated by electrical signals transmitted between the door operating mechanism 13 and a controller 14.

FIG. 4 discloses a source 15 of gaseous atmosphere connected to the chamber 11 by a conduit 16 and a control valve 17 that controls a flow of the gaseous atmosphere from the source 15 to the chamber 11. The control valve 17 is opened and closed by a motor driven, valve control mechanism 18 that is operated by electrical signals transmitted between the valve control mechanism 18 and the controller 14. Opening the control valve 17 introduces the gaseous atmosphere into the chamber 11. According to one embodiment, the valve 17 and controller 14 comprise a mass flow control mechanism to introduce a precise mass of gaseous atmosphere of measured chemical moles to form a resistant film 8 of desired thickness on the low topography features 7. Thereby, the gaseous atmosphere is substantially expended to form the resistant film 8. According to another embodiment, the resistant film 8 forms during a time duration sufficient to form a resistant film 8 of desired thickness on the low topography features 7, followed by removing the remainder of the gaseous atmosphere from the chamber 11, for example, by exhaust of the gaseous atmosphere through an exhaust conduit 19.

FIG. 4 discloses a motor driven, pick and place mechanism 20 that picks up the semiconductor wafer 1, for example, between reciprocating jaws 21, inserts the wafer 1 in the chamber 11, and places the wafer 1 so as to impinge the shield 9 similarly as disclosed by FIG. 1. Accordingly, the pick and place mechanism 20 imparts relative movement of the shield 9 and the corresponding semiconductor wafer 1 to impinge the shield 9 against high topography features 6 on the surface of the corresponding semiconductor wafer 1. After releasing the wafer 1, the pick and place mechanism 20 is withdrawn from the chamber 11, while the door 12 quickly closes to entrap the gaseous atmosphere in an enclosed chamber 11. The pick and place mechanism 20 is operated by electrical signals transmitted between the pick and place mechanism 20 and the controller 14. The resistant film 8 forms by contact of the gaseous atmosphere with the low topography features 7. Subsequently, after passage of sufficient time to form the resistant film 8, the door 12 is opened, and the semiconductor wafer 1 is removed from the chamber 11 by operation of the pick and place mechanism 20.

FIG. 4 discloses the controller 14 connected by signal transmitting conductors 22 to the door operating mechanism 13, the control valve 17, and the pick and place mechanism 20. Alternatively, the controller 14 may communicate with signals propagated by wireless transmission. Although he controller 14 is depicted as a single electronic unit that integrates multiple electronic devices for controlling the door 12, the control valve 17, and the pick and place mechanism 20, the controller 14 further comprises, such multiple electronic devices as separate units. Further, the controller 14 further comprises, a machine programmable device that operates the various devices according to a desired sequence of operation.

According to an embodiment of the invention, the chamber 11 is provided as an annealing oven supplying heat at a controlled temperature, for example, in the range of 100 to 500 degrees C. The wafer 1 remains in the closed chamber 11 for a time duration sufficient for annealing the corresponding semiconductor wafer 1 to a desired resistivity. The metal layer 5 is annealed to lower its resistivity for compliance with industry accepted, technical standards for such resistivity. Both annealing and formation of the resistant film 8 occur simultaneously in the chamber 11 of an annealing oven. Advantageously, the formation of a resistant film 8 takes place within the time duration of the annealing process.

According to an embodiment of the invention, a semiconductor wafer 1 is adapted for planarization by having a resistant film 8 selectively formed on low topography features 7 on the semiconductor wafer 1. While polishing the semiconductor wafer 1 with a polishing pad and a polishing fluid, the resistant film 8 on the low topography features 7 resists the polishing fluid, which minimizes the removal rate of the low topography features 7, while the high topography features 6 react chemically with the polishing fluid and dissolve, which removes the high topography features 6 at a faster removal rate than the low topography features 7.

The invention adapts a metal layer 5 for planarization by providing a resistant film 8 on low topography features 7 on the metal layer 5 to resist polishing fluid while the metal layer 5 is polished by a polishing pad and the polishing fluid to remove the high topography features 6. Because the high topography features 6 are removed at a faster removal rate than the low topography features 7, the time duration for attaining planarization is minimized by the invention.

According to an embodiment, a semiconductor wafer 1 has a metal layer 5 of copper. A polishing fluid comprising, in part, deionized water and hydrogen peroxide, together with a polishing pad, are used to polish the copper by CMP. Thus, the metal layer 5 of copper chemically reacts with the polishing fluid and dissolves according to the chemical reactions:

$$Cu + H_2O_2 \Leftrightarrow Cu_2O + H_2O \tag{1}$$

$$Cu_2O + H_2O_2 \Leftrightarrow Cu(OH)_2 + H_2O \tag{2}$$

$$Cu(OH)_2 \Leftrightarrow CuO + H_2O \tag{3}$$

According to an embodiment of the invention, he low topography features 7 on the wafer 1 are exposed to a copper oxide forming atmosphere in an enclosed chamber 11 for a time duration sufficient to form a uniform oxide film of a thickness that is sufficient to resist the polishing composition. For example, the oxide film is $Cu_2O$, and comprises the resistant film 8. The oxide film is formed with a sufficient thickness to resist the polishing composition by being resistant to wetting by the deionized water of the polishing fluid. Thereby, chemical reaction (2), above is precluded from reaction with the resistant film 8, while the high topography features 6 of the metal layer 5 are removed by polishing with the polishing pad and the polishing fluid. Planarization is attained in a minimized time duration for polishing, because the resistant film 8 minimizes the removal rate of the low topography features 7, while the high topography features 6 are removed at a faster removal rate than the low topography features 7.

Further, as disclosed by FIG. 3, once the metal layer 5 becomes substantially planar with the low topography features, polishing is continued. Thereby, the polishing pad contacts the surface of the resistant film 8, which breaks the surface tension of the polishing fluid in contact with the resistant film 8, which wets the resistant film 8 with the polishing fluid. The resistant film 8 reacts chemically with the hydrogen peroxide and dissolves, according to the chemical reaction (2), above. Thereby, the resistant film 8 is removed, both by abrasion applied by the polishing pad, and by chemical reaction with the polishing fluid and dissolution. Both the metal layer 5 of Cu, and the resistant film 8, are removed at substantially the same removal rate, once planarization is attained, in a manner disclosed by FIG. 3.

According to an embodiment, a patterned semiconductor wafer 1 having a metal layer 5 of copper is placed in an annealing oven, with the metal layer 5 inverted and engaged against an optically flat shield 9. The metal layer 5 has a surface topography with both high topography features 6 and low topography features 7. The high topography features 6 are known to extend in a range of 5000 Angstroms to 7000 Angstroms beyond the low topography features 7. The high topography features 6 impinge the shield 9, which holds the low topography features 7 spaced from the shield 9. A gas permeable space is present between the shield 9 and each of the low topography features 7. A gaseous atmosphere, comprised of high purity oxygen, conducive to forming a resistant film 8 of oxide of the type $Cu_2O$ on a Cu surface is present in the oven during the time that the patterned wafer 1 undergoes a known annealing process. The known annealing process is performed by using a known annealing oven in which the patterned wafer 1 is subjected to a specified elevated temperature for a specified time duration. Industry standard annealing ovens operate at a fixed temperature in a range of 100 to 500 degrees Centigrade. According to an embodiment of the invention, the film is $Cu_2O$. However the invention further includes the formation of any film suitable for resisting a polishing fluid, which film forms onto a metal layer 5 by contact with a film forming gaseous atmosphere, such as, a gaseous atmosphere adapted with film forming constituents of gaseous state.

The shield 9 is a flat plate of a material capable of being machined to a flat surface that will be in intimate engagement with the high topography features 6 on the metal layer 5, and which will avoid scratching of the metal layer 5. Embodiments of the shield 9 include, and are not limited to, alumina (white sapphire), silica (quartz), polytetrafluoroethylene or steel, any of which are capable of being manufactured, such as, by machining and polishing, to a desired flatness, as, for example, a desired flatness specified by an industry standard, technical specification known as "optically flat".

The invention pertains to a process, according to which, a film suitable for repelling a polishing fluid, forms onto low topography features 7 on a metal layer 5 of a patterned wafer 1, and adapts the wafer 1 for removal of the low topography features 7 at a slower removal rate by polishing with a polishing pad and with a polishing fluid with which the metal layer 5 chemically reacts and dissolves for removal of high topography features 6 of the metal layer 5.

The invention pertains to a process, according to which, a film, that is suitable for resisting a polishing fluid, forms onto low topography features 7 on a metal layer 5 of a patterned wafer 1, and adapts the low topography features 7 for minimized removal rate by polishing with a polishing pad and with a polishing fluid with which the metal layer 5 chemically reacts and dissolves for removal of high topography features 6 of the metal layer 5.

According to an embodiment of the invention, the low topography features 7 on the wafer 1 are exposed to a copper oxide forming atmosphere in the oven for a time duration sufficient to form a uniform oxide film of a thickness that is sufficient to resist the polishing composition. The desired oxide film forms on low topography features 7 on the metal layer 5, coextensively within the time duration of the known annealing process. As a result, when the annealed wafer 1 is finished with the annealing process, the metal layer 5 is not only annealed, but also is adapted with a film that resists a polishing fluid, and that is formed selectively on low topography features 7 on the metal layer 5.

According to an embodiment, the invention pertains to a process, according to which, a film, that is resistant to a polishing fluid, forms onto low topography features 7 on a metal layer 5 of a semiconductor wafer 1, and adapts the low topography features 7 for minimized removal rate by polishing with a polishing pad and with a polishing fluid with which the metal layer 5 chemically reacts and dissolves for removal of high topography features 6 of the metal layer 5.

Although embodiments of the invention are disclosed, other embodiments and modifications of the invention are intended to be covered by the spirit and scope of the appended claims.

What is claimed is:

1. A method of planarizing a semiconductor wafer comprising the steps of:

shielding the semiconductor wafer to form a resistant film selectively on low topography features of a metal layer of the semiconductor wafer in relation to high topography features of the metal layer of the semiconductor wafer to resist chemical reaction and dissolution of a polishing fluid at the low topography features of the metal layer of the semiconductor wafer; and polishing the metal layer with a polishing pad and with the polishing fluid to chemically react and dissolve the high topography features at a faster removal rate than the low topography features and to attain planarization of the semiconductor wafer with a reduced polishing time.

2. The method as recited in claim 1, wherein the step of shielding includes impinging the high topography features with a shield to reduce the resistant film formation on the high topography features while the forming step forms the resistant film on the low topography features that are spaced from the shield.

3. The method as recited in claim 2, further comprising the step of:

introducing a film forming gaseous atmosphere between the low topography features and the shield, and the forming includes contacting the low topography features with a film forming gaseous atmosphere to farm the resistant film on the low topography features.

4. The method as recited in claim 1, further comprising the step of:

annealing the metal layer, and the step of forming the resistant film on the low topography features of the metal layer of the semiconductor wafer occurs while annealing the metal layer.

5. A method of planarizing a semiconductor wafer comprising the steps of:

shielding the semiconductor wafer to form a resistant film selectively on low topography features of a copper layer of the semiconductor wafer in relation to high topography features of the copper layer of the semiconductor wafer to resist chemical reaction and dissolution of a polishing fluid at the low topography features of the copper layer of the semiconductor wafer; and polishing the copper layer with a polishing pad and with the polishing fluid to chemically react and dissolve the high topography features at a faster removal rate than the low topography features and to attain planarization of the semiconductor wafer with a reduced polishing time.

6. The method as recited in claim 1, wherein the step of shielding includes impinging the high topography features with a shield to reduce the resistant film formation on the high topography features while the forming step forms the resistant film on the low topography features that are spaced from the shield.

7. The method as recited in claim 6, further comprising the step of:

introducing a film forming gaseous atmosphere between the low topography features and the shield, and the forming includes contacting the low topography features with a film forming gaseous atmosphere to form the resistant film on the low topography features.

8. The method of claim 7 wherein the introducing step introduces oxygen between the low topography features and the shield to form a copper oxide.

9. The method as recited in claim 5, further comprising the step of:

annealing the metal layer, and the step of forming the resistant film on the low topography features the metal layer of the semiconductor wafer occurs while annealing the metal layer.

10. The method of claim 9 wherein the shielding forms the resistant film with copper oxide.

* * * * *